US012608071B2

(12) United States Patent
Nge et al.

(10) Patent No.: US 12,608,071 B2
(45) Date of Patent: Apr. 21, 2026

(54) PREVENTION OF UNEXPECTED SHUTDOWN

(71) Applicant: Apple Inc., Cupertino, CA (US)

(72) Inventors: Chee Lim Nge, Cupertino, CA (US); Peter Hyungrok Sung, Santa Clara, CA (US); Douglas A MacKay, San Mateo, CA (US); Diwakar N Tundlam, Saratoga, CA (US); Jun Hou, San Jose, CA (US); Tu Le, Los Gatos, CA (US); Vishal Gupta, Sunnyvale, CA (US); Ning Tian, San Jose, CA (US); Daniele Perretta, Redwood City, CA (US); Bo Zhou, Santa Clara, CA (US); Michael Eng, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/465,785

(22) Filed: Sep. 12, 2023

(65) Prior Publication Data

US 2025/0085765 A1     Mar. 13, 2025

(51) Int. Cl.
G06F 1/32 (2019.01)
G01R 31/387 (2019.01)
(Continued)

(52) U.S. Cl.
CPC ......... G06F 1/3265 (2013.01); G01R 31/387 (2019.01); G06F 1/3218 (2013.01); G06F 1/3203 (2013.01); G06F 1/3287 (2013.01)

(58) Field of Classification Search
CPC .... G06F 1/3265; G06F 1/3218; G01R 31/387
(Continued)

(56) References Cited

U.S. PATENT DOCUMENTS 7,861,102 B1 * 12/2010 Ranganathan ........ G06F 1/3206
                                                      713/340
9,244,474 B2     1/2016 Smith
                        (Continued)

FOREIGN PATENT DOCUMENTS

EP          3067779         7/2019

OTHER PUBLICATIONS

International Search Report for PCT/US2024/043656; Dec. 23, 2024.

*Primary Examiner* — Volvick Derose
(74) *Attorney, Agent, or Firm* — Kowert, Hood, Munyon, Rankin & Goetzel, P.C.

(57) ABSTRACT

Systems and methods are disclosed for allocating and distributing power management budgets for subsystems of a computer system. For each of a plurality of subsystems, a power management system may generate a long-term power budget and a closed-loop power budget, and then determine a final power budget to provide to the subsystem, e.g., by applying a min function, a weighted sum, or some other function to the long-term power budget and the closed-loop power budget. The closed-loop power budget is determined based on observations of power draw over a past period of time, and therefore cannot respond immediately to large changes in power. The long-term power budget is generated based on a prediction of battery capability over an upcoming window of time, and may therefore provide a power cap before the system is under duress.

15 Claims, 8 Drawing Sheets

(51) Int. Cl.
*G06F 1/3218* (2019.01)
*G06F 1/3234* (2019.01)
*G06F 1/3203* (2019.01)
*G06F 1/3287* (2019.01)

(58) Field of Classification Search
USPC ........................................................ 713/320
See application file for complete search history.

(56) References Cited

U.S. PATENT DOCUMENTS

| 9,971,390 | B1 * | 5/2018 | Becker .................... G06F 1/329 |
| 10,168,762 | B2 * | 1/2019 | Hankendi ............... G06F 1/329 |
| 10,852,804 | B2 | 12/2020 | Jenne |
| 10,860,083 | B2 * | 12/2020 | Degalahal ............. G06F 1/3296 |
| 10,871,818 | B1 * | 12/2020 | De La Cropte De Chanterac ...... G06F 1/325 |
| 2010/0162006 | A1 | 6/2010 | Therien |
| 2011/0040996 | A1 * | 2/2011 | Hackborn ........... G06F 11/3409 713/340 |
| 2011/0178652 | A1 * | 7/2011 | Carter .................... G06F 1/329 700/296 |
| 2012/0005513 | A1 | 1/2012 | Brock |
| 2012/0116599 | A1 * | 5/2012 | Arndt ........................ G06F 1/26 700/291 |
| 2013/0046967 | A1 * | 2/2013 | Fullerton .................. G06F 1/32 713/100 |
| 2014/0067293 | A1 * | 3/2014 | Parivar ................. G06F 1/3203 702/60 |
| 2014/0067295 | A1 * | 3/2014 | Putman .................. G06Q 50/06 702/61 |
| 2014/0149760 | A1 * | 5/2014 | Drake ................... G06F 9/5094 713/320 |
| 2016/0062439 | A1 * | 3/2016 | Lu .......................... G06F 1/3206 713/320 |
| 2016/0070326 | A1 * | 3/2016 | Hsiao .................... G06F 1/1626 713/320 |
| 2017/0192477 | A1 | 7/2017 | Lefurgy |
| 2018/0111497 | A1 * | 4/2018 | Li ............................. B60L 7/10 |
| 2019/0041951 | A1 * | 2/2019 | Shapira ................. G06F 1/3287 |
| 2019/0041969 | A1 | 2/2019 | Nge |
| 2019/0041971 | A1 | 2/2019 | Ananthakrishnan |
| 2019/0104480 | A1 * | 4/2019 | Hasholzner ............. G06F 1/324 |
| 2019/0163250 | A1 * | 5/2019 | Lee ..................... G06F 11/3062 |
| 2019/0204900 | A1 | 7/2019 | Nair |
| 2020/0201408 | A1 | 6/2020 | Lehwalder |
| 2020/0264692 | A1 * | 8/2020 | Gorbatov ............. G06F 1/3296 |
| 2020/0379534 | A1 * | 12/2020 | Zahir ................... H02J 7/0048 |

* cited by examiner

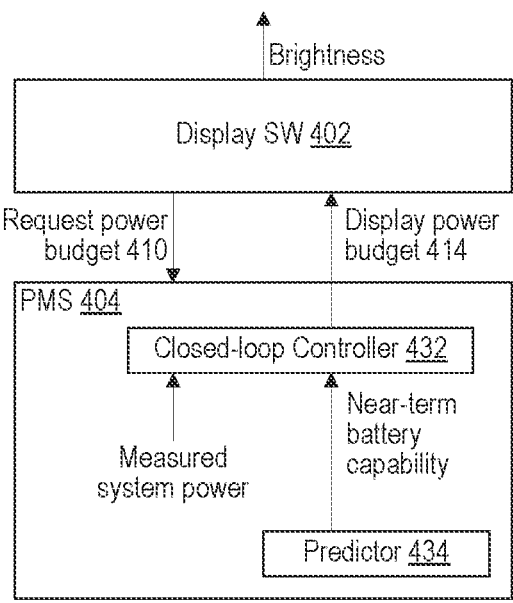
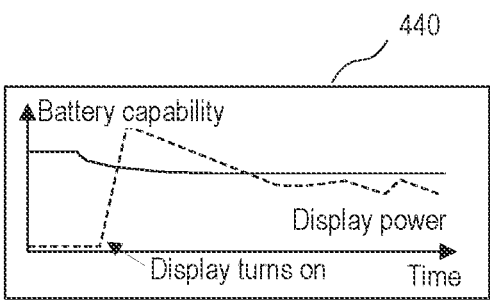
Closed-loop Power Response
FIG. 4B

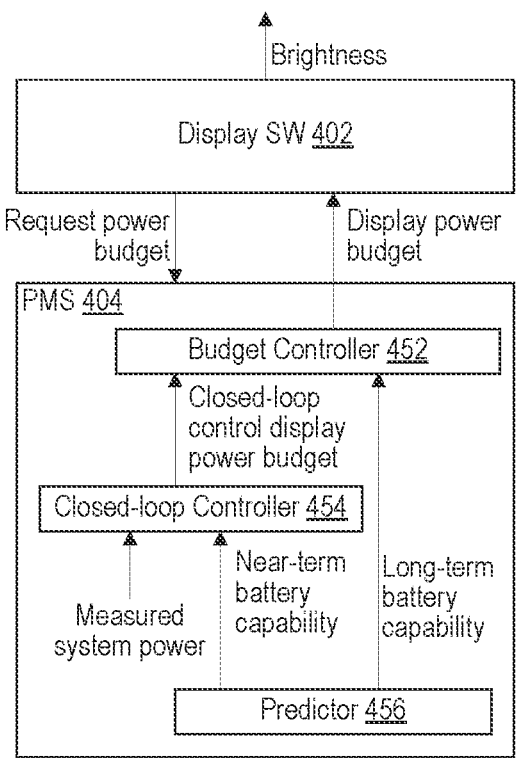
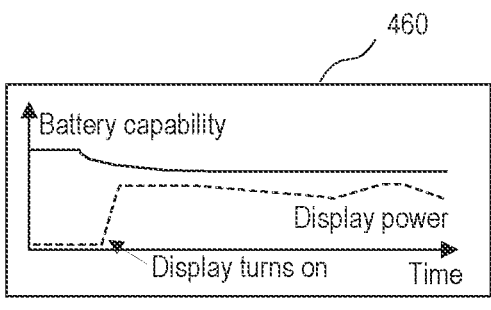
Long-term Power Response
FIG. 4C

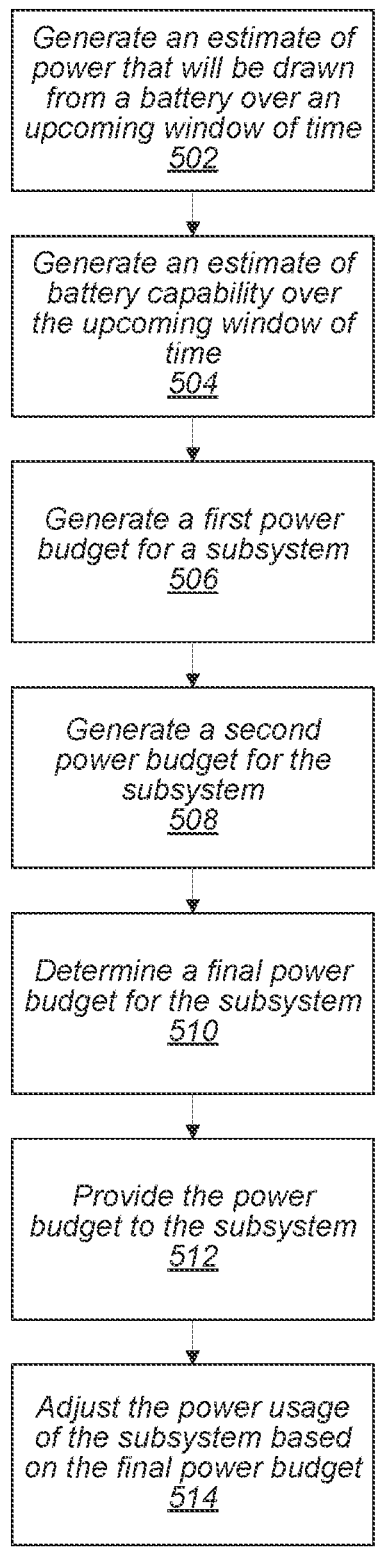

Generate an estimate of
power that will be drawn
from a battery over an
upcoming window of time
502

Generate an estimate of
battery capability over
the upcoming window of
time
504

Generate a first power
budget for a subsystem
506

Generate a second
power budget for the
subsystem
508

Determine a final power
budget for the subsystem
510

Provide the power
budget to the subsystem
512

Adjust the power usage
of the subsystem based
on the final power budget
514

*FIG. 5*

PREVENTION OF UNEXPECTED SHUTDOWN

FIELD

Embodiments described herein are related to the field of integrated circuits, and more particularly to power management of circuits in an integrated circuit.

DESCRIPTION OF THE RELATED ART

An electronic device, including a systems-on-a-chip (SoC), may include one or more processor cores as well as multiple other circuits such as co-processors, audio and video circuits, networking and communication interfaces, and the like. The device may include power management circuitry that helps distribute power from the battery to the circuits within the device. To prevent an excessive load from being applied to the battery and the battery from dropping below a cut-off voltage, the power management circuitry may control power consumption by components in the device.

SUMMARY

Embodiments are presented herein of, inter alia, systems and associated methods for allocating and distributing power management budgets for subsystems of a computer system.

A battery-powered device is disclosed, including a battery; a plurality of subsystems configured to draw power from the battery, wherein each subsystem of the plurality of subsystems is configured to adjust its power usage based on a respective power budget; and a power management module. The power management module is configured to generate an estimate of power that will be drawn from the battery over an upcoming window of time; generate an estimate of battery capability over the upcoming window of time, based on the estimate of power; generate a first respective power budget for each of one or more of the subsystems, based on the estimate of battery capability; and generate a second respective power budget for each of the one or more of the subsystems, based on a closed-loop feedback path. The power management module is further configured to determine a final respective power budget for each of the one or more of the subsystems, based on the first respective power budget and the second respective power budget; and provide the final respective power budget to each of the one or more of the subsystems.

In some scenarios, a first subsystem of the plurality of subsystems may include a display. In some such scenarios, the first subsystem may be configured to adjust its power usage based on the final respective power budget by adjusting a brightness level of the display.

In some scenarios, the final respective power budget may include an indication of a maximum power level for use by the applicable subsystem, wherein the applicable subsystem is configured to adjust its power usage based on the final respective power budget by adjusting its operating parameters such that its power usage remains below the maximum power level.

In some scenarios, the first respective power budget for a first subsystem of the plurality of subsystems may be configured to prevent the first subsystem from drawing power in excess of the estimate of battery capability over the upcoming window of time.

In some scenarios, the estimate of battery capability is further based on a present state of the battery.

In some scenarios, determining the final respective power budget may include selecting between the first respective power budget and the second respective power budget, wherein the respective power budget indicating a lower maximum power level is selected.

In some scenarios, determining the final respective power budget may include determining a weighted sum of the first respective power budget and the second respective power budget.

In some scenarios, generating the estimate of battery capability over the upcoming window of time may be performed periodically, wherein the period varies based on at least one of present power output of the battery or the most recent estimate of long-term battery capability.

In some scenarios, generating the estimate of battery capability over the upcoming window of time may be performed in response to a trigger event. In some such scenarios, the trigger event may be determining that a subsystem of the plurality of subsystems is performing an action that will cause a step increase in power.

A method is disclosed, in which an apparatus may generate an estimate of power that will be drawn from a battery over an upcoming window of time; generate an estimate of battery capability over the upcoming window of time, based on the estimate of power; generate a first power budget for a subsystem powered by the battery, the first power budget based on the estimate of battery capability; and generate a second power budget for the subsystem, the second power budget based on a closed-loop feedback path. The apparatus may also determine a final power budget for the subsystem, the final power budget based on the first power budget and the second power budget; and provide the final power budget to the subsystem. The apparatus may adjust power usage of the subsystem based on the final power budget.

In some scenarios, the final power budget may include an indication of a maximum power level for use by the subsystem.

In some scenarios, the subsystem may include a speaker, wherein adjusting power usage of the subsystem based on the final power budget may include adjusting a volume level of audio output from the speaker such that the power level of the subsystem remains below the maximum power level.

In some scenarios, determining the final power budget may include selecting between the first power budget and the second power budget, wherein the power budget indicating a lower maximum power level is selected.

In some scenarios, generating the estimate of battery capability over the upcoming window of time may be performed in response to determining that the subsystem is performing an action that will cause a step increase in power.

A power management device is disclosed, including a long-term power estimator configured to generate an estimate of power that will be drawn from a battery over an upcoming window of time. The power management device may also include a long-term battery capability predictor configured to generate an estimate of capability of the battery over the upcoming window of time, based on the estimate of power and a present state of the battery. The power management device may also include a long-term controller configured to generate one or more long-term power budgets for respective one or more subsystems powered by the battery, wherein the long-term power budgets are configured to prevent the one or more subsystems from exceeding the capability of the battery over the upcoming window of time. The power management device may also include a closed-loop controller configured to generate one or more closed-loop power budgets for the one or more subsystems, wherein the closed-loop power budgets are based on power levels observed over a past window of time. The power management device may also include a budget controller configured to provide one or more output power budgets to the one or more subsystems, wherein the output power budgets are generated based on the long-term budgets and the closed-loop budgets.

In some scenarios, each of the output power budgets may be generated by selecting between a respective one of the long-term power budgets and a respective one of the closed-loop power budgets, wherein the respective power budget indicating a lower maximum power level is selected.

In some scenarios, each of the output power budgets may be generated by determining a weighted sum of a respective one of the long-term power budgets and a respective one of the closed-loop power budgets.

In some scenarios, generating the estimate of capability of the battery over the upcoming window of time may be performed periodically, wherein the period varies based on at least one of present power output of the battery or the most recent estimate of capability of the battery.

Non-transitory computer-readable memory media are described, storing software instructions to cause processing circuitry to operate substantially as described in any of the preceding scenarios.

This summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present subject matter can be obtained when the following detailed description of the embodiments is considered in conjunction with the following drawings.

FIG. 4B is a block diagram further illustrating the operations of the scenario of FIG. 4A, as implemented by a closed-loop power management system, according to some embodiments.

FIG. 4C is a block diagram further illustrating the operations of the scenario of FIG. 4A, as implemented by an enhanced power management system, according to some embodiments.

FIG. 5 illustrates an example method for providing power management for a battery-powered device, according to some embodiments.

Figure 1:
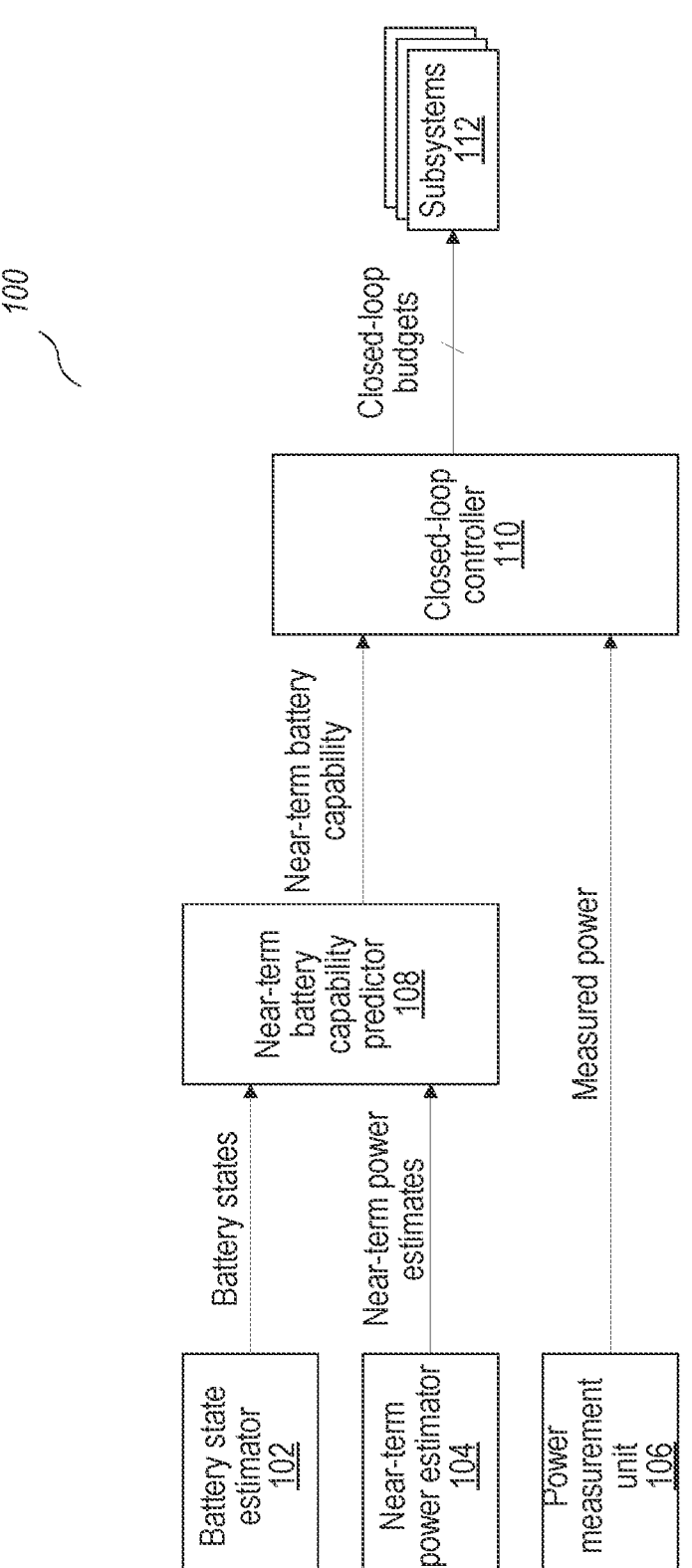
FIG. 1 illustrates an example of a closed-loop power management system, according to some embodiments.

While the features described herein are susceptible to various modifications and alternative forms, specific embodiments thereof are shown by way of example in the drawings and are herein described in detail. It should be understood, however, that the drawings and detailed description thereto are not intended to be limiting to the particular form disclosed, but on the contrary, the intention is to cover all modifications, equivalents and alternatives falling within the spirit and scope of the subject matter as defined by the appended claims.

DETAILED DESCRIPTION

Incorporation by Reference

The following references are hereby incorporated by reference as if fully set forth herein:

U.S. Pat. No. 11,728,668
U.S. Pat. No. 11,513,576
U.S. Pat. No. 10,830,821
U.S. Provisional Patent Application No. 63/528,634 filed on Jul. 17, 2023, entitled "Power Management for Audio Alerts for Electronic Devices".

Terminology

The following is a glossary of terms used in this disclosure:

Memory Medium—Any of various types of non-transitory memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may include other types of non-transitory memory as well or combinations thereof. In addition, the memory medium may be located in a first computer system in which the programs are executed, or may be located in a second different computer system which connects to the first computer system over a network, such as the Internet. In the latter instance, the second computer system may provide program instructions to the first computer for execution. The term "memory medium" may include two or more memory mediums which may reside in different locations, e.g., in different computer systems that are connected over a network. The memory medium may store program instructions (e.g., embodied as computer programs) that may be executed by one or more processors.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices including multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Processing Element—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors.

Automatically—refers to an action or operation performed by a computer system (e.g., software executed by the computer system) or device (e.g., circuitry, programmable hardware elements, ASICs, etc.), without user input directly specifying or performing the action or operation. Thus, the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

The term "configured to" is used herein to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke interpretation under 35 U.S.C. § 112 (f) for that unit/circuit/component.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

Figure 2:
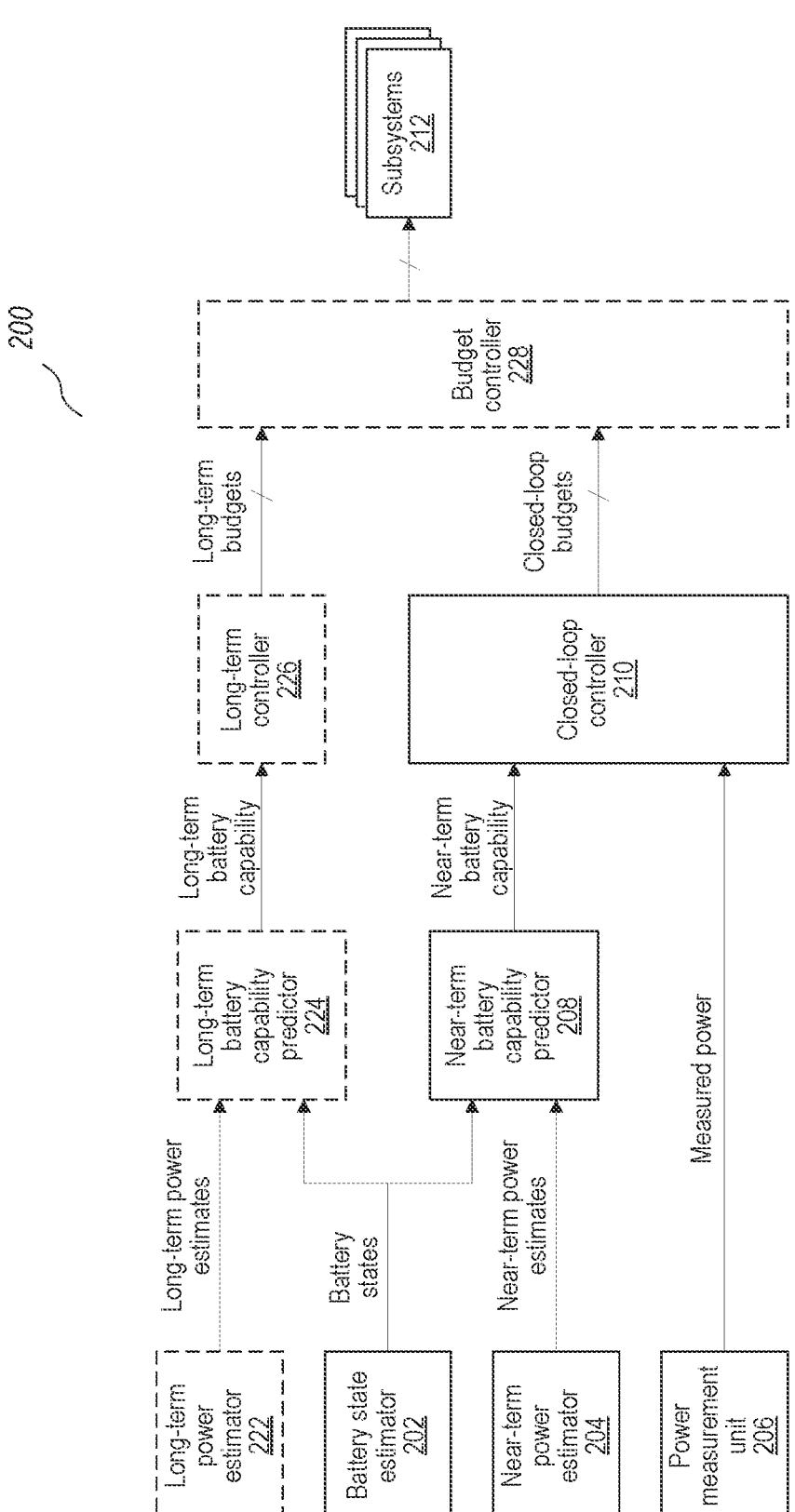
FIG. 2 illustrates an example of a power management system enhanced with an open-loop path for long-term budget estimation, according to some embodiments.

FIGS. 1-2—Power Management Systems

Power management systems may be used in computer systems, including systems-on-a-chip (SoCs), to monitor an amount of power being used by one or more circuits. Such power management systems may be particularly important in mobile devices, or other devices that operate with a limited power supply, such as a battery. Based on the current amount of power being used and/or a prediction of future power use, a power management system may define an amount of power to be used by various portions of the computer system. For example, the power management system may seek to adjust power usage of a subsystem of the computer system based on any combination of various competing factors, such as system performance, battery life, prevention of brownouts due to momentarily overtaxing the battery, reduction of heat generated by the computer system, etc. Such subsystems may be referred to herein as "clients" of the power management system.

Clients may vary widely in function, and may therefore also vary widely in power usage. For example, a first client may include a graphical output display. Power consumption of such a client may be modified, e.g., by changing a refresh rate or a brightness level, among other parameters. As another example, a second client may include a wireless communication radio. Power consumption of the second client may be modified, e.g., by modifying transmit power, entering an idle mode, etc. As another example, a third client may include a processor, such as a CPU or GPU. Power consumption of the third client may be modified, e.g., by changing a clock rate, limiting a number of processor cores in use, etc. As another example, a fourth client may include an audio output device, such as one or more speakers. Power consumption of the fourth client may be modified, e.g., by changing an output volume level. Thus, the functional details of limiting power consumption of a client may vary significantly between various clients.

For this reason, a power management system may control various clients by providing to each client a respective power budget. In response to receiving such a power budget, a client may adjust its power usage to comply with the budget, based on the operational characteristics of the client.

A power management system may estimate an amount of power being used by some or all circuits in the computer system, based on, e.g., voltage and/or current levels of a battery output, frequencies of clock signals, and/or current operating modes of the circuits. To generate the power estimates, these values may be sampled on a periodic basis.

Power measurements and subsequent power adjustments by the clients require time. This introduces a time delay between the measurement of the current power usage and any reaction by the clients. Thus, the power management system may utilize closed-loop feedback controllers to attempt to more effectively manage power consumption limits. However, various clients may respond to inputs at different rates, e.g., based on their individual operational parameters. Thus, in some implementations, it may be beneficial to define a plurality of loops in the feedback system, to accommodate a plurality of categories of clients, such as fast-reacting clients and slow-reacting clients.

In existing computer systems, a power management system may include a closed-loop feedback mechanism, e.g., with multiple sampling rates and/or multiple feedback loops. FIG. 1 illustrates an example of such a power management system, designed to reduce the peak power budgets for one or more subsystems when the system power consumption is higher than the near-term battery capability. More generally, the power management system may be designed to allow the subsystems to meet their power needs, to the extent feasible, while preventing an excessive load from being applied to the battery, which might cause the battery to drop below a cut-off voltage ($V_{cut}$). If the battery drops below $V_{cut}$, then the computer system may temporarily suspend the functioning of some systems or subsystems to prevent damage to the battery, operational errors, and/or complete power failure of the system.

As shown, the power management system 100 may include a battery state estimator 102, which may estimate the current state of the battery of the computer system. The battery state estimator 102 may provide, to a near-term battery capability predictor 108, information regarding battery state, such as present voltage, open-circuit voltage (OCV), battery impedance, state of charge, capacity, temperature, an aging indicator, and/or other state parameters of the battery, and/or information defining a mathematical model of the battery. The battery state information may be provided, e.g., periodically or continuously. In some implementations, various portions of the battery state estimator 102 may be implemented substantially according to the methods and systems described in U.S. Pat. No. 11,728,668, which was incorporated by reference above.

The power management system 100 may also include a near-term power estimator 104, which may estimate a prediction of the future power demands of the computer system over a near-term time window. In some scenarios, the near-term time window may be on the scale of seconds or milliseconds, e.g., 100 ms, 1 s, or 10 s. The near-term power estimator 104 may provide a near-term power estimate, based on its prediction, to the near-term battery capability predictor 108. The near-term power estimates may be provided, e.g., periodically or continuously.

The near-term battery capability predictor 108 may estimate the capability of the battery to meet the power demands of the computer system over the near-term time window, based on the battery state information received from the battery state estimator 102 and the near-term power estimate received from the near-term power estimator 104. The near-term battery capability predictor may provide information regarding the estimated near-term battery capability to a closed-loop controller 100, e.g., periodically or continuously.

The power management system 100 may also include a power measurement unit 106, which may measure the present power output of the battery and/or the present power usage of the computer system. Information regarding the measured power may be provided to the closed-loop controller 110. In some implementations, the power measurement unit 106 may sample the power output, e.g., periodically or continuously, and may convert the measurement signal to a digital signal, e.g., using one or more analog-to-digital converters (ADCs). The power measurement unit 106 may filter the digital signal according to one or more filters having different filtering thresholds (e.g., using a 100 ms low pass filter, a 1 s low pass filter, a 10 s low pass filter, etc.), to provide information regarding various aspects of changes in the power level, such as power spike, pulse, and baseline values. In some implementations, such filtered digital signals may be included in the information regarding the measured power, as provided to the closed-loop controller 110.

The closed-loop controller 110 may receive the information regarding the near-term capability and the information regarding the measured power, and may use those inputs to determine a respective power budget to each of one or more client subsystems. Specifically, the closed-loop controller 110 may employ various means (such as the means described in U.S. Pat. No. 11,513,576, incorporated by reference above, or other means, as known in the art) to adjust respective maximum power budgets available to the one or more client subsystems, e.g., to allow the subsystems to meet their power needs, to the extent feasible, while preventing an excessive load from being applied to the battery. The closed-loop controller 110 may provide a respective power budget to each of one or more of the subsystems 112. A power budget may include at least an indication of a peak (e.g., maximum) power level approved for use by the respective subsystem. In some scenarios, the power budget may include additional information, such as a maximum average power level, a maximum power spike level, etc.

It should be noted that such closed-loop controllers respond reactively to system changes, based on sampling and/or averaging battery state and/or power measurements over one or more periods of time. Thus, the closed-loop system is inherently limited to near-term fluctuations, predicted based on recent changes in state. The reactive nature of this mechanism is not suitable for some scenarios.

For example, existing power management system designs may perform unsatisfactorily with subsystems capable of drawing high peak power, while being slow to react to updated peak power budgets. For example, large or bright display technologies can consume significantly higher power than many mobile batteries can reliably supply, and those displays may quickly transition from a low, easily supported power to a power that is well above what can be supported by the system's battery, e.g., in response to the content on screen or the average picture level (APL) changing. On the other hand, the maximum allowed display brightness should be reduced slowly to avoid undesirable user-facing visual behavior. E.g., a wearable device, such as a smart watch may configure its screen at a low brightness level in some situations, but may suddenly and significantly brighten the screen when it detects motion indicative of the user raising their wrist. Because the recent power draw has been low, the closed-loop controller may have allowed assignment of a power budget to the screen that the battery cannot sustain over a long-term window. The closed-loop controller may be unable to adjust the power budget until the feedback loop (e.g., Proportional Integral (PI) controllers, etc.) can incorporate the sudden step in power. In the meantime, the screen may be allowed to jump to the too-bright level allowed by the outdated power budget. Thus, if the power management system consists of a closed-loop system, such as that shown in FIG. 1, the power management system may be constrained to either rapidly decrease the screen brightness once the feedback loop has caught up, which may lead to a poor user experience, or else risk a brownout, as the battery is overtaxed.

Similarly, existing power management system designs may perform unsatisfactorily with subsystems preferring a high peak power, but which require a certain minimum threshold power level to be effective. For example, certain emergency features, such as an audible emergency siren or an emergency communication mode, may be most effective when using maximum power allowed within the assigned budget. However, if the closed-loop system has allocated a budget with a high peak power, because the recent power draw has been low, then the emergency feature may activate at a power level that the battery cannot maintain. As a result, the battery may quickly be overtaxed, resulting in a brownout. To prevent brownout, the closed-loop power management system may react by allocating a new budget with a peak power level that is too low for the emergency feature to be effective. For example, an emergency siren may be insufficiently loud, or the emergency communication mode may have insufficient transmit power.

As another example, existing power management system designs may perform unsatisfactorily with subsystems that require a steady-state peak power budget that may exceed battery capability. Since a reactive power budget is based on existing system power consumption, the budget could change drastically within a few seconds. For example, a consistent volume from an audio speaker may be desirable throughout an audio playback session that lasts for several seconds.

As yet another example, existing power management system designs may perform unsatisfactorily with subsystems that cannot be mitigated, in which the system policy relies on providing early warning to the user. In such a scenario, users may require notification well in advance of any action that would traditionally engage a closed loop peak power control system. However, a purely open-loop control would over-mitigate such a subsystem, resulting in undesirable behavior.

To address these issues, a new power management system design may utilize a combination of closed-loop and open-loop controls. This may prevent bursty, slow-to-respond subsystems from generating loads that would impact system functionality, prevent the over-mitigation of subsystems that occurs with simpler open-loop controls, and provide the ability to generate long-term forward-looking budgets that can trigger user notification or other slow-to-respond actions.

FIG. 2 shows a block diagram of a power management system 200 including an open-loop path for long-term budget estimation and control, as well as a closed-loop system, according to some embodiments.

As illustrated, the power management system 200 may include modules 202-212, which may be substantially similar or identical to modules 102-112 of FIG. 1. Modules 202-212 may constitute a closed-loop feedback portion of the power management system 200, and may be configured to generate closed-loop budgets, primarily configured to manage near-term power considerations.

As shown, the power management system 200 may also include a long-term power estimator 222, which may generate a prediction of future long-term power of the system. In this context, "long-term" may constitute several seconds (e.g., 5 s, 10 s, 30 s) or minutes (e.g., 2 minutes) into the future. The long-term power estimator 222 may base its prediction on pre-defined power profiles and/or on historical data, such as the average power or max power throughout an observation window (e.g., 10 s). The prediction may include values such as an average DC power or maximum peak power in the future time window. The long-term power estimator 222 may provide the prediction, or a portion thereof, as a long-term power estimate to a long-term battery capability predictor 224, e.g., periodically, continually, or based on a trigger event.

The long-term battery capability predictor 224 may receive the long-term power estimates from the long-term power estimator 222, as well as battery state information from the battery state estimator 202. Based on the current battery state and the estimate of how much power will be drawn from the battery over the prediction window, the long-term battery capability predictor 224 may predict battery power capabilities that are seconds or minutes in the future; e.g., the prediction window of the long-term power estimator 222. For example, the long-term battery capability predictor 224 may utilize a detailed battery model with the received battery state information and long-term power estimates to predict changes in battery impedance, OCV, capacitance, and/or other factors over the long-term prediction window, to predict the maximum power the battery can support without violating the $V_{cut}$ threshold. The long-term battery capability predictor 224 may provide information regarding the long-term battery capability to a long-term controller 226, e.g., periodically, continually, or based on a trigger event.

The long-term controller 226 may receive the information regarding the long-term battery capability, and may use that input to generate long-term power budgets for the one or more subsystems 212. For example, the long-term controller 226 may generate long-term power budgets based on a lookup table or step function, with reference to the information regarding the long-term battery capability. As another example, the long-term controller 226 may generate long-term power budgets based on a piecewise linear function, a fixed offset, an mX+b slope and offset function, or some other function, with reference to the information regarding the long-term battery capability. Notably, the closed-loop controller 210 may generate closed-loop budgets based on measured power and measured battery state, while the long-term controller 226 may generate the long-term power budgets based on long-term predictions, rather than being constrained to power and state measured over a past window. Thus, the long-term controller 226 may preemptively apply reduced power budgets when the measured power is still low. The long-term controller 226 may provide the long-term power budgets to the budget controller 228.

The budget controller 228 may receive the long-term power budgets from the long-term controller 226, as well as the closed-loop budgets from the closed-loop controller 210. For a given subsystem of the subsystems 212, the budget controller 228 may receive both a long-term budget and a closed-loop budget, and may determine a final budget to assign to the subsystem. In some scenarios, the budget controller 228 may select one of these two received budgets based on a min function, to provide the budget indicating the lower peak power, e.g., to ensure that the subsystem does not exceed the peak power prediction of either the closed-loop path or the long-term path. In some scenarios, the budget controller 228 may determine a budget as a weighted sum of the respective long-term budget and the respective closed-loop budget. Other procedures are also envisioned for determining the final budget. For each of the subsystems 212, the budget controller may provide the respective final power budget to the subsystem.

In response to receiving a power budget, a subsystem of the subsystems 212 may adjust its operation to comply with a maximum power specified by the power budget. For example, a screen or other graphic display may limit its maximum brightness or a speaker may limit its maximum volume. As another example, a high-power external accessory, such as an accessory connected via a USB-C port, may provide an early low-battery warning. As yet another example, an external accessory may limit its power capability advertisement.

In some scenarios, the power management system 200 may be implemented on a single system-on-chip (SoC) or other type of one or more integrated circuits. Performing the applicable battery measurements and processing in the power management system 200 may avoid the need to include an analog-to-digital converter (ADC) and/or other components within each client, which may save manufacturing and/or processing costs.

Operational Examples of the Power Management System

Figure 3:
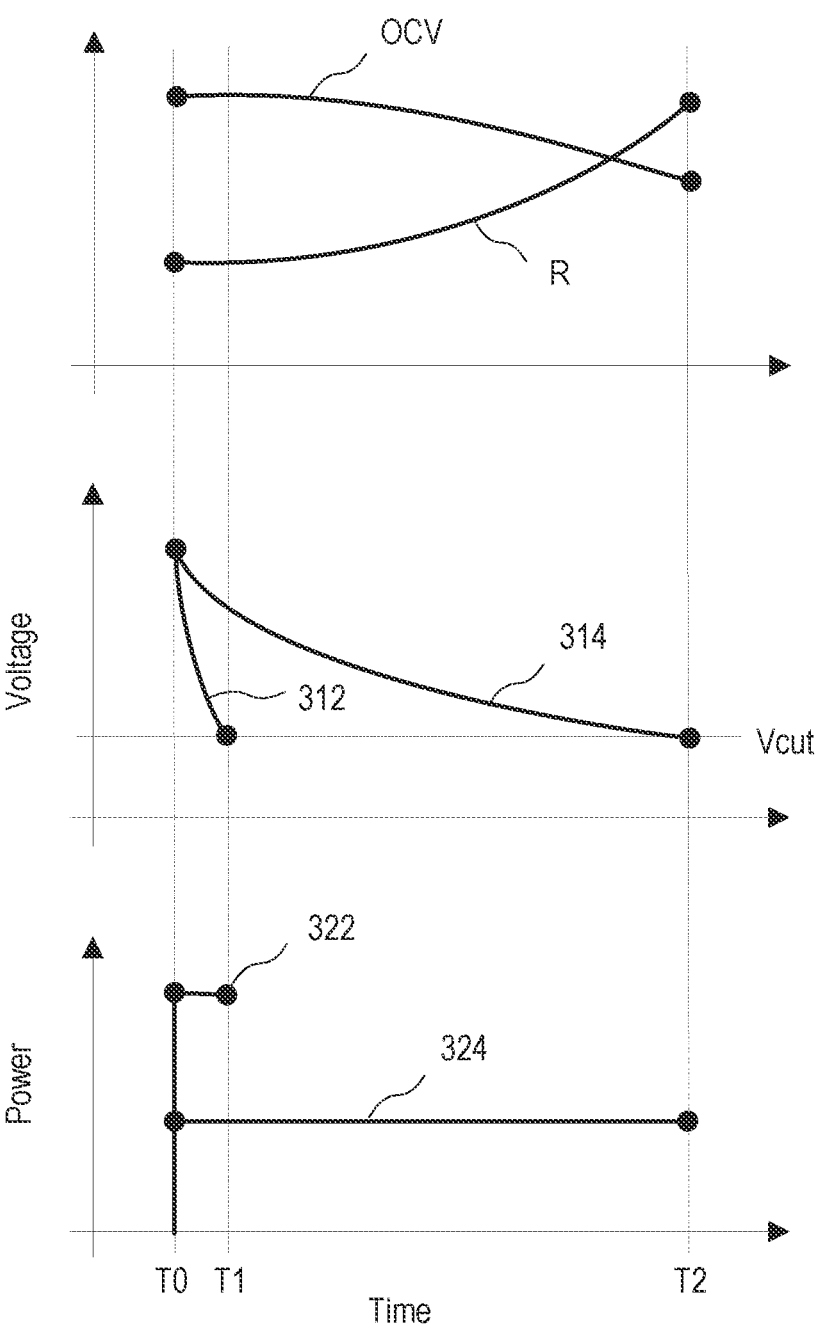
FIG. 3 illustrates an example of voltage and power response resulting from two power management systems, according to some embodiments.

Predicting long-term battery capability, e.g., as performed by the system of FIG. 2, may be significant to avoiding overtaxing the battery in some scenarios. For example, impedance (R) and OCV can change dramatically, which is not addressed in traditional closed-loop algorithms. This may be explained by reference to FIG. 3, which illustrates an example of voltage and power response according to the systems of FIG. 1 and FIG. 2, respectively, in response to changes in R and OCV. As shown in FIG. 3, for the near term (e.g., from T0 to T1, which may be measured in milliseconds or a few seconds), the variations in R and OCV appear negligible. Therefore, the near-term assessment performed by the closed-loop system of FIG. 1 may ignore variations in R and OCV. Thus, as illustrated, a power budget may be set to allow power output 322 at a high power level. In response, the voltage 312 may rapidly fall to $V_{cut}$, without consideration of upcoming conditions. Because the closed-loop system cannot predict operation beyond the end of a near-term time window (T1), it allows a power budget that may result in the battery being overtaxed shortly after the end of that window.

However, if the predictive horizon becomes long (e.g., T0 to T2, which may be several or many seconds), the variation can significantly affect the max battery power capability prediction. For example, as illustrated in FIG. 3, a predicted increase in R and/or decrease in OCV may cause the long-term path to specify a power budget with a maximum power output 324 at a lower level, so as to allow the battery to accommodate the predicted changes in R and OCV throughout the prediction window.

Thus, the system illustrated in FIG. 2 may generate long-term power budgets before the system is under duress, unlike purely closed-loop control schemes, while also considering closed-loop power budgets based on present system capability, to avoid the over-mitigation problems that occur with purely open-loop control schemes or other schemes that allow early system mitigation.

The resulting budgets successfully prevent uncontrolled system shutdown due to either large, sudden, or slow to respond step loads beyond what the system can support, while simultaneously providing an improved (e.g., maximum) power budget during ongoing periods of activity. This system may prevent bursty slow-to-respond subsystems from generating loads that would impact system functionality, prevent over-mitigation of subsystems that occurs with simpler open-loop controls, and provide the ability to generate long-term forward-looking budgets that can trigger user notification or other slow-to-respond actions.

In some implementations, the long-term power path illustrated in FIG. 2, or portions thereof, may run continuously or periodically. For example, the long-term power estimator 222 may continuously or periodically provide long-term power estimates to the long-term battery capability predictor 224. Similarly, the battery state estimator 202 may continuously or periodically provide updated battery state information to the long-term battery capability predictor 224. The long-term battery capability predictor 224 may periodically or continuously provide information regarding long-term battery capability, or may provide such information in response to a trigger event. For example, the long-term battery capability predictor 224 may provide information regarding long-term battery capability in response to determining that an analysis of the current long-term power estimate and the current battery state information suggests that the predicted long-term power estimate cannot be supported by the battery, or will cause the voltage to drop below $V_{cut}$, or will meet some other threshold criterion. The long-term controller may continuously or periodically provide updated long-term budgets, or may provide updated long-term budgets in response to receiving updated information regarding long-term battery capability, or in response to the received information varying from a previous version of the information by some threshold amount, or in response to some other trigger event.

In some implementations, the long-term power path may run periodically with a period that varies depending on the long-term battery capability and/or the measured power. For example, determining long-term power estimates, determining long-term battery capability, and/or determining long-term budgets may be performed periodically.

In some implementations, the long-term power path illustrated in FIG. 2, or portions thereof, may run in response to a trigger event. For example, in response to a trigger event, the long-term power estimator 222 may provide a long-term power estimate, potentially based at least in part on current information regarding the trigger event, and the long-term battery capability may use that estimate to provide long-term battery capability, which may be used by the long-term controller 226 to provide long-term budgets. The budget controller 228 may then determine final budgets to provide to one or more of the subsystems 212. Because the long-term power path is an open-loop system, it can provide updated long-term budgets very quickly, without the delay of allowing feedback controllers to adjust to updated conditions, as may be required in the closed-loop path. Thus, the long-term power path may be configured to run in response to an event that may indicate a need for one or more updated power budgets, potentially before a significant change in power level occurs.

For example, the long-term power path may operate to generate one or more updated long-term budgets in response to determining (e.g., being notified by another module of the computer system) that one of the subsystems 212 is increasing its power draw or is performing an action that will cause a step increase in power draw, such as a display increasing its brightness or a speaker increasing its volume. As another example, the trigger event may be (or include) determining that an event has occurred which may be expected to result in a step increase in power draw by one of the subsystems 212, such as, in a smart watch or other wearable device, determining that the user has raised their wrist, which may result in a display significantly increasing its brightness. As yet another example, the trigger event may be (or include) a change in power usage (e.g., beyond a threshold value) by a system component that is not managed by the power management system 200. Such system components may include, but are not limited to, communication circuitry, such as a Wi-Fi or cellular radio. In other implementations, such communication circuitry may be managed by the power management system 200.

In such examples, the power management system 200 may be able to provide updated final power budgets, based on updated long-term budgets, that prevent the battery from being overtaxed. For example, if the computer system detects that the user raises their wrist, with an expected result that the display will perform a significant step increase in brightness (or if the computer system detects any other indication that the display is performing, or imminently will perform, a step increase in brightness), with an associated step increase in power usage, then the power management system 200 may quickly generate updated long-term budgets and resulting final budgets, and may provide one or more of the final budgets to the subsystems 212, including to the display. Specifically, the power management system 200 may determine that a previously active power budget for the display will not be sustainable by the battery in the long term in light of the increased power draw by the display (and/or in light of other power changes that may result from a raised wrist, such as waking a CPU or other components). In making such a determination, the long-term power estimator 222 may have access to information regarding upcoming behavior of the display and/or other subsystems or components, for use in generating a long-term power estimate. The power management system 200 may therefore provide a new long-term power budget for at least the display, based on the present long-term power estimate and the present battery state estimate. The new long-term power budget may have a lower peak power level than the previously active power budget for the display, wherein the new long-term power budget is determined such that it will be sustainable by the battery at least throughout the duration of the prediction window. The budget controller 228 may select the new long-term power budget as the final power budget for the display (e.g., using a min function) or may otherwise determine a final budget based on the new long-term power budget.

In this example, the display may receive the new final power budget, and may operate accordingly. For example, the display may cap its peak brightness to comply with a peak power level specified by the new long-term budget, and may increase its brightness (and its power draw) to operate at that peak level. This may result in a step increase in power draw from the battery. Such an increase will take time to process through the digital filters, feedback controllers, and other components of the closed-loop path before it will be reflected in the closed-loop budgets.

In some scenarios, once the closed-loop budgets have been updated in response to this step increase in power, the resulting closed-loop budget for the display may have a peak power level that is even lower than that specified by the long-term budget. In such a scenario, the budget controller 228 may update the final power budget for the display, based on the updated closed-loop power budget (e.g., using a min function to select between the long-term budget and the closed-loop budget). The display may comply with the updated final power budget by further reducing its brightness. However, the display is unlikely to need to reduce its brightness by a significant amount at this stage, because the long-term power budget initially prevented the display from increasing its brightness to an unsustainable level. Thus, the power management system 200 may prevent a scenario in which the display performs a sudden step increase in brightness, followed immediately by a sudden and noticeable drop in brightness, which would result in an undesirable user experience. In general, the power management system 200 may be tuned to allow the closed-loop path to dominate budget management while the system is active, but to utilize the long-term path to prevent unsustainable step increases, e.g., during system state changes.

Figure 4A:
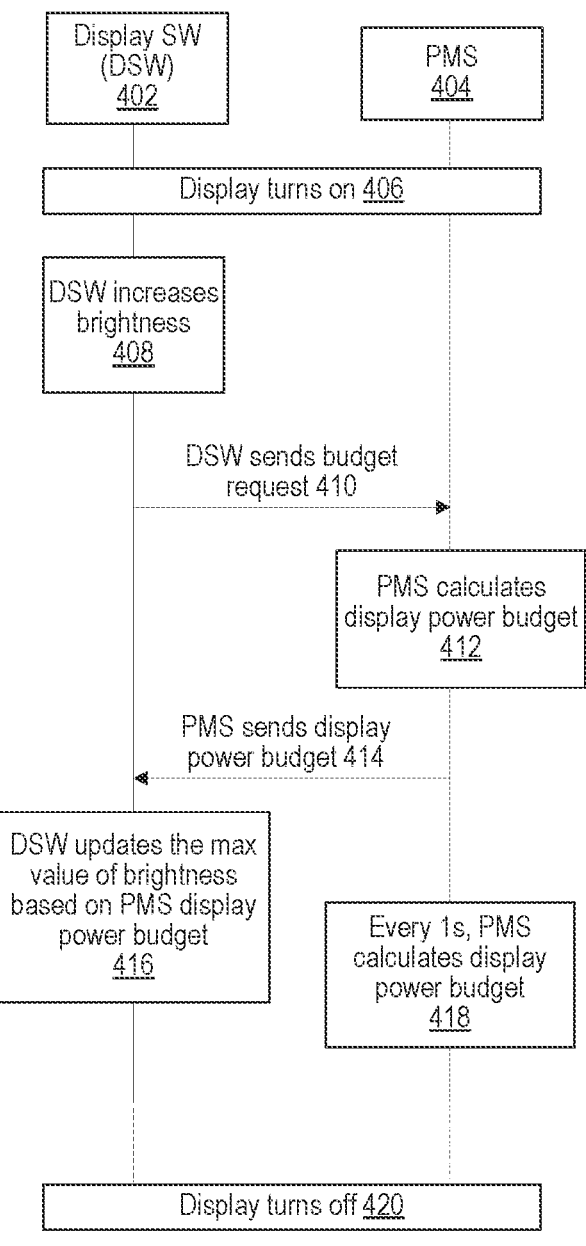
FIG. 4A is a signal flow diagram illustrating operational steps performed by a power management system (PMS) and a display software (DSW) module of a computer system in an example operational scenario, according to some embodiments.

FIGS. 4A-C further illustrate the operations and distinctions of the power management system 100 and the power management system 200. FIG. 4A is a signal flow diagram illustrating operational steps performed by a power management system (PMS) and a display software (DSW) module of a computer system in an example operational scenario. FIG. 4B is a block diagram further illustrating the operations of the scenario of FIG. 4A, as implemented by a closed-loop power management system, such as the power management system 100 of FIG. 1, along with a graphic representation of the power response that would occur in that scenario. FIG. 4C is a block diagram further illustrating the operations of the scenario of FIG. 4A, as implemented by an enhanced power management system, such as the power management system 200 of FIG. 2, along with a graphic representation of the power response that would occur in that scenario.

As illustrated in FIG. 4A, a DSW module 402 may communicate with a PMS 404. The DSW module 402 may be included within a display subsystem managed by the PMS 404, and may constitute or include a software module capable of controlling the brightness of display hardware, such as a touchscreen interface or other graphic display. As illustrated, the display first turns on at 406. This may occur in connection with initial booting of the computer device or at some later time, after the display has entered an off state. After the display turns on, the DSW module 402 may increase its brightness at 408, e.g., to a default or preferred level, or to a level determined based on present conditions, such as ambient light. The DSW module 402 may, at 408, increase its brightness to any desired level within constraints defined by a current power budget for the display.

The DSW module 402 then sends, at 410, a power budget request to the PMS 404, requesting an updated power budget, based on system conditions. In response, the PMS 404 calculates, at 412, a power budget for the display and sends the power budget, at 414, to the DSW module 402. The power budget may indicate a maximum (e.g., peak) power level for use by the display. The DSW module 402 receives the power budget and updates the maximum brightness value of the display, e.g., to a value that will not cause the power drawn by the display to exceed the maximum power level indicated by the power budget.

Thereafter, the PMS 404 may calculate an updated power budget for the display, e.g., at regular intervals. As illustrated, the interval may be every 1 second, though this is merely one example, and other intervals are also envisioned. In some scenarios, the PMS 404 may provide each updated power budget to the DSW module 402. In other scenarios, the PMS 404 may provide an updated power budget to the DSW module 402 in response to a trigger event, such as the updated power budget differing from the most recently provided power budget by some threshold amount.

This may continue until the display turns off at 420. This may constitute entering an off state, which may include entirely terminating functionality of the display, e.g., when the computer system is powered off, or may include entering a non-display period or low-display period, in which the display is powered down, but the DSW module 402 may remain active or operational.

In the scenario of FIG. 4B, the scenario of FIG. 4A is implemented using a closed-loop PMS, such as the power management system 100 of FIG. 1, to implement the PMS 404. For simplicity, only certain portions of the PMS 404 are illustrated.

As illustrated, the DSW module 402 may, at 410, send a power budget request to the PMS 404, and the PMS 404 may, at 414, provide a power budget for the display to the DSW module 402. FIG. 4B further illustrates that the power budget may be provided by a closed-loop controller 432 of the PMS, which may be an example of the closed-loop controller 110. The closed-loop controller 432 may generate the power budget based on measured system power (e.g., from the power measurement unit 106) and information regarding near-term battery capability from a predictor 434, which may be an example of the near-term battery capability predictor 108.

FIG. 4B also includes a graphic representation 440 of the power response that would occur in this scenario. The graphic representation includes a solid line representing battery capability and a dotted line representing power drawn by the display. As illustrated, following the point in time at which the display turns on, the display rapidly increases brightness, potentially to the peak level allowed by the present power budget. Because the system was previously in a more idle state with little power draw, the closed-loop PMS 404 may have previously provided a power budget with a very high peak power level. Further, because the PMS 404 in this example is a closed-loop system, any updated power budget will take time to register this additional power draw, as the predictor generates a near-term battery capability based on past power usage. Thus, the PMS 404 will be unable to provide an updated power budget that caps the display power below the battery capability until after the display power has already exceeded the battery capability. Although the PMS 404 may eventually provide an appropriately adjusted power budget, the system may experience a brownout before that time, as the battery is not capable of supporting the power drawn by the display.

In the scenario of FIG. 4C, the scenario of FIG. 4A is implemented using an enhanced PMS, such as the power management system 200 of FIG. 2, to implement the PMS 404, which includes both one or more closed-loop paths and also an open-loop long-term path. For simplicity, only certain portions of the PMS 404 are illustrated.

As illustrated, the DSW module 402 may, at 410, send a power budget request to the PMS 404, and the PMS 404 may, at 414, provide a power budget for the display to the DSW module 402. FIG. 4C further illustrates that the power budget may be provided by a budget controller 452 of the PMS 404, such as the budget controller 228. The budget controller 452 may generate the power budget based on a closed-loop power budget provided by a closed-loop controller 454, such as the closed loop controller 210, as well as information regarding long-term battery capability from a predictor 456, such as the long-term battery capability predictor 224. It should be noted that, for simplicity, the long-term controller 226 of FIG. 2 is not shown in FIG. 4C, and similar functionality may instead be considered to be included in the budget controller 452. Similarly, the predictor 456 may include functionality similar to both the near-term battery capability predictor 208 and the long-term battery capability predictor 224.

As in FIG. 4B, the closed-loop controller 454 may generate the closed-loop power budget based on measured system power and information regarding near-term battery capability from the predictor 456.

FIG. 4C also includes a graphic representation 460 of the power response that would occur in this scenario. The graphic representation includes a solid line representing battery capability and a dotted line representing power drawn by the display. As illustrated, following the point in time at which the display turns on, the display rapidly increases brightness, potentially to the peak level allowed by the present power budget. Because the system was previously in a more idle state with little power draw, the PMS 404 may have previously provided a power budget with a very high peak power level. However, because the PMS 404 in this example includes a long-term control path, the budget controller may be able to generate an updated budget to cap the display power below the level of the battery capability before the display power increases beyond that point. At a later point, the display power may further decrease, e.g., as the closed-loop path registers the increased power draw and provides a more appropriate closed-loop power budget. Thus, the enhanced PMS 404 of FIG. 4C is more appropriate for systems that may experience large power step increases.

It should be understood that the examples of FIGS. 4A-C are specific examples, and other scenarios are also envisioned. For example, in other scenarios, the PMS 404 may provide an updated budget for the display before the DSW module 402 initially increases brightness. For example, the PMS 404 may determine an updated budget in response to a trigger event, such as the display turning on or a user raising their wrist, which will lead to the display turning on. In yet other scenarios, budgets may be provided to other subsystems and/or in response to other events.

FIG. 5—Example Method

FIG. 5 illustrates an example of a method of providing power management for a battery-powered device, according to some embodiments. The method of FIG. 5 may be implemented by the battery-powered device, or by some portion thereof. For example, the method of FIG. 5 may be implemented by the power management system 200 of FIG. 2, by a computer system including such a power management system, or by a similar system or apparatus. Although the following discussion will be made with reference to the power management system, it should be understood that this should not be limited to the specific example of the power management system 200 illustrated in FIG. 2, but may also apply more broadly to other examples of power management systems capable of implementing the methods described.

As shown in FIG. 5, the system may, at 502, generate an estimate of power that will be drawn from a battery over an upcoming window of time.

At 504, the system may generate an estimate of battery capability over the upcoming window of time. The estimate of battery capability may be based on one or more of the estimate of power, a present state of the battery, a mathematical model of the battery, etc.

At 506, the system may generate a first power budget for a subsystem powered by the battery. For example, the first power budget may be a long-term power budget. The first power budget may include an indication of a maximum power level for use by the subsystem. The first power budget may be configured to prevent the subsystem from exceeding the capability of the battery over the upcoming window of time. The first power budget may be based on the estimate of battery capability, a present state of the battery, a mathematical model of the battery, etc. In some scenarios, the system may generate a plurality of first power budgets for a corresponding plurality of subsystems.

At 508, the system may generate a second power budget for the subsystem. For example, the second power budget may be a closed-loop power budget. The second power budget may be based on one or more closed-loop feedback loop. For example, the second power budget may be based on power levels observed over a past window of time. In some scenarios, the system may generate a plurality of second power budgets for a corresponding plurality of subsystems.

At 510, the system may determine a final power budget for the subsystem 510. For example, the system may select between the first power budget and the second power budget, wherein the power budget indicating a lower maximum power level is selected. As another example, the system may determine a weighted sum of the first power budget and the second power budget; e.g., between their respective maximum power levels. In some scenarios, the system may generate a plurality of final power budgets for a corresponding plurality of subsystems.

At 512, the system may provide the power budget to the subsystem. In some scenarios, the system may provide a plurality of final power budgets to a corresponding plurality of subsystems.

At 514, the system may adjust the power usage of the subsystem based on the final power budget. For example, the subsystem may be configured to adjust its power usage based on the final power budget by adjusting its operating parameters such that its power usage remains below the maximum power level.

As one example, the subsystem may include a display. The display may be configured to adjust its power usage based on the final power budget by adjusting its brightness level. As another example, the subsystem may include a speaker, which may be configured to adjust its power usage based on the final power budget by adjusting a volume level of audio output from the speaker such that its power usage remains below a maximum power level indicated by the final power budget.

In some scenarios, the system may, at 514, adjust the power usage of a plurality of subsystems, based on a corresponding plurality of final power budgets.

In some scenarios, the method of FIG. 5, or certain steps thereof, such as step 504, may be performed periodically. In some scenarios, the period may vary based on various factors, such as the present power output of the battery and/or the most recent estimate of long-term battery capability.

In some scenarios, the method of FIG. 5 may be performed in response to a trigger event, such as the system determining that the subsystem (or another subsystem) is performing an action that will cause a step increase in power.

It should be understood that the method shown in FIG. 5 is one example of performing power management, and that numerous variations may be employed. In various scenarios, one or more of the steps shown may be removed or reordered, and/or additional steps may be added.

Figure 6:
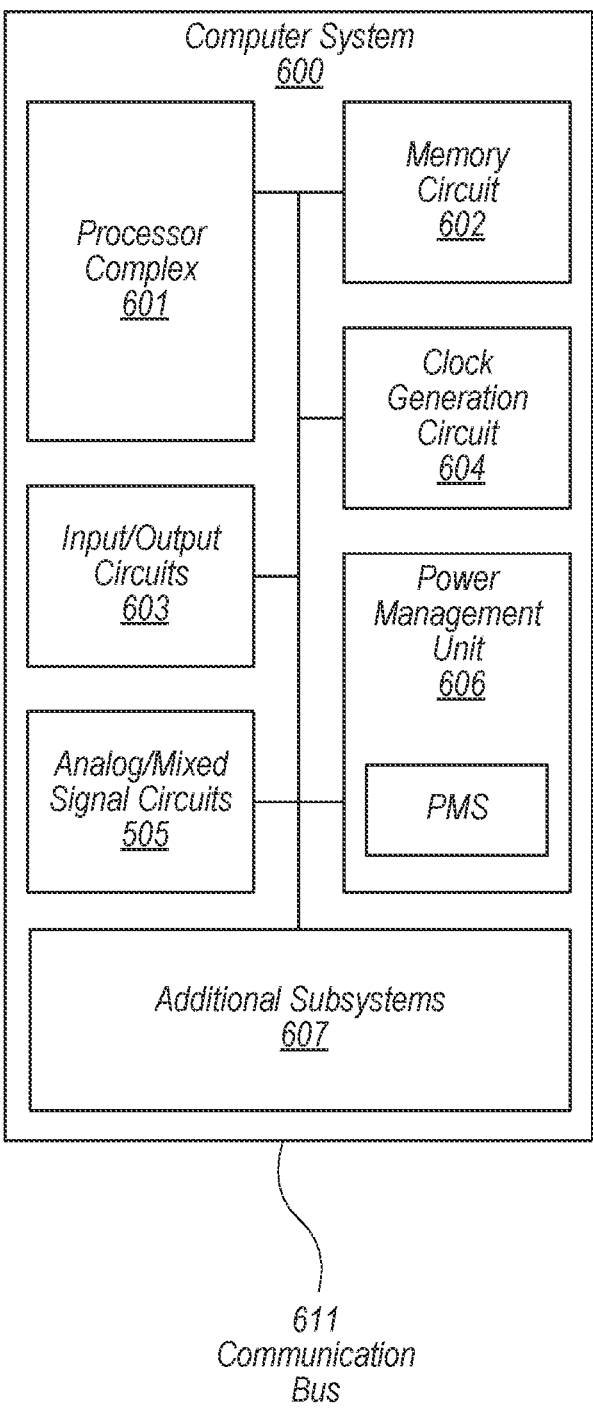
FIG. 6 is a block diagram illustrating a computer system that includes the power management system of FIG. 2, according to some embodiments.

FIG. 6—Computer System

FIGS. 2 and 5 illustrate an apparatus and method for a power management system. Power management systems, such as those described above, may be used in a variety of computer systems, such as a desktop computer, laptop computer, smartphone, tablet, wearable device, and the like. In some embodiments, the systems described above may be implemented on a system-on-chip (SoC) or other type of one or more integrated circuits. A block diagram illustrating an embodiment of computer system 600 that includes the disclosed systems is illustrated in FIG. 6. In some embodiments, computer system 600 may provide an example of an integrated circuit that includes the power management system of FIG. 2. As shown, computer system 600 includes processor complex 601, memory circuit 602, input/output circuits 603, clock generation circuit 604, analog/mixed-signal circuits 605, and power management unit 606. These functional circuits are coupled to each other by communication bus 611.

Processor complex 601, in various embodiments, may be representative of a general-purpose processor that performs computational operations. For example, processor complex 601 may be a central processing unit (CPU) such as a microprocessor, a microcontroller, an application-specific integrated circuit (ASIC), or a field-programmable gate array (FPGA). In some embodiments, processor complex 601 may correspond to a special purpose processing core, such as a graphics processor, audio processor, or neural processor, while in other embodiments, processor complex 601 may correspond to a general-purpose processor configured and/or programmed to perform one or more of such functions. Processor complex 601, in some embodiments, may include a plurality of general and/or special purpose processor cores as well as supporting circuits for managing, e.g., power signals, clock signals, and memory requests. In addition, processor complex 601 may include one or more levels of cache memory to fulfill memory requests issued by included processor cores.

Memory circuit 602, in the illustrated embodiment, includes one or more memory circuits for storing instructions and data to be utilized within computer system 600 by processor complex 601. In various embodiments, memory circuit 602 may include any suitable type of memory such as a dynamic random-access memory (DRAM), a static random access memory (SRAM), a read-only memory (ROM), electrically erasable programmable read-only memory (EEPROM), or a non-volatile memory, for example. It is noted that in the embodiment of computer system 600, a single memory circuit is depicted. In other embodiments, any suitable number of memory circuits may be employed.

Input/output circuits 603 may be configured to coordinate data transfer between computer system 600 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 603 may be configured to implement a version of Universal Serial Bus (USB) protocol or IEEE 1394 (Firewire®) protocol.

Input/output circuits 603 may also be configured to coordinate data transfer between computer system 600 and one or more devices (e.g., other computing systems or integrated circuits) coupled to computer system 600 via a network. In one embodiment, input/output circuits 603 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 603 may be configured to implement multiple discrete network interface ports.

Clock generation circuit 604 may be configured to enable, configure and manage outputs of one or more clock sources. In various embodiments, the clock sources may be located in analog/mixed-signal circuits 605, within clock generation circuit 604, in other blocks with computer system 600, or come from a source external to computer system 600, coupled through one or more I/O pins. In some embodiments, clock generation circuit 604 may be capable of enabling and disabling (e.g., gating) a selected clock source before it is distributed throughout computer system 600. Clock generation circuit 604 may include registers for selecting an output frequency of a phase-locked loop (PLL), delay-locked loop (DLL), frequency-locked loop (FLL), or other type of circuits capable of adjusting a frequency, duty cycle, or other properties of a clock or timing signal.

Analog/mixed-signal circuits 605 may include a variety of circuits including, for example, a crystal oscillator, PLL or FLL, and a digital-to-analog converter (DAC) (all not shown) configured to generated signals used by computer system 600. In some embodiments, analog/mixed-signal circuits 605 may also include radio frequency (RF) circuits that may be configured for operation with cellular telephone networks. Analog/mixed-signal circuits 605 may include one or more circuits capable of generating a reference voltage at a particular voltage level, such as a voltage regulator or band-gap voltage reference.

Power management unit 606 may be configured to generate a regulated voltage level on a power supply signal for processor complex 601, input/output circuits 603, memory circuit 602, and other circuits in computer system 600. In various embodiments, power management unit 606 may include one or more voltage regulator circuits, such as, e.g., a buck regulator circuit, configured to generate the regulated voltage level based on an external power supply (not shown). In some embodiments any suitable number of regulated voltage levels may be generated. Additionally, power management unit 606 may include various circuits for managing distribution of one or more power signals to the various circuits in computer system 600, including maintaining and adjusting voltage levels of these power signals. Power management unit 606 may include circuits for monitoring power usage by computer system 600, including determining or estimating power usage by particular circuits. For example, power management unit 606 may determine power usage by each of a plurality of processor circuits in processor complex 601. Based on the determined power usage, power management unit 606 may allocate a respective number of power credits to some or all of the particular circuits. The power management system of FIG. 2 may, in some implementations, be included in power management unit 606 or in processor complex 601.

Additional subsystems 607 may include a variety of additional subsystems managed by the power management unit 606, such as one or more displays, speakers, communications systems, etc. The additional subsystems 607 may receive power budgets from the power management system.

It is noted that the embodiment illustrated in FIG. 6 includes one example of a computer system. A limited number of circuit blocks are illustrated for simplicity. In other embodiments, any suitable number and combination of circuit blocks may be included. For example, in other embodiments, security and/or cryptographic circuit blocks may be included.

Embodiments of the present disclosure may be realized in any of various forms. For example, some embodiments may be realized as a computer-implemented method, a computer-readable memory medium, or a computer system. Other embodiments may be realized using one or more custom-designed hardware devices such as ASICs. Still other embodiments may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a device (e.g., any one or more of the devices or systems illustrated in any of the figures) may be configured to include a processor (or a set of processors) and a memory medium, where the memory medium stores program instructions, where the processor is configured to read and execute the program instructions from the memory medium, where the program instructions are executable to implement a method, e.g., any of the various method embodiments described herein (or any combination of the method embodiments described herein, or any subset of any of the method embodiments described herein, or any combination of such subsets). The device may be realized in any of various forms.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A battery-powered device comprising:
   a battery;
   a plurality of subsystems configured to draw power from the battery, wherein each subsystem of the plurality of subsystems is configured to adjust its power usage based on a respective power budget; and
   a power management module configured to:
      generate an estimate of power that will be drawn from the battery over an upcoming window of time;
      generate an estimate of battery capability over the upcoming window of time, based on the estimate of power;
      generate a first respective power budget for each of one or more of the subsystems, based on the estimate of battery capability;
      generate a second respective power budget for each of the one or more of the subsystems, based on a closed-loop feedback path;
      determine a final respective power budget for each of the one or more of the subsystems, based on the first respective power budget and the second respective power budget, wherein determining the final respective power budget comprises determining a weighted sum of the first respective power budget and the second respective power budget; and
      provide the final respective power budget to each of the one or more of the subsystems.

2. The device of claim 1, wherein a first subsystem of the plurality of subsystems comprises a display.

3. The device of claim 2, wherein the first subsystem is configured to adjust its power usage based on the final respective power budget by adjusting a brightness level of the display.

4. The device of claim 1, wherein the final respective power budget comprises an indication of a maximum power level for use by the applicable subsystem, wherein the applicable subsystem is configured to adjust its power usage based on the final respective power budget by adjusting its operating parameters such that its power usage remains below the maximum power level.

5. The device of claim 1, wherein the first respective power budget for a first subsystem of the plurality of subsystems is configured to prevent the first subsystem from drawing power in excess of the estimate of battery capability over the upcoming window of time.

6. The device of claim 1, wherein the estimate of battery capability is further based on a present state of the battery.

7. The device of claim 1, wherein generating the estimate of battery capability over the upcoming window of time is performed periodically, wherein the period varies based on at least one of present power output of the battery or the most recent estimate of long-term battery capability.

8. The device of claim 1, wherein generating the estimate of battery capability over the upcoming window of time is performed in response to a trigger event.

9. The device of claim 8, wherein the trigger event is determining that a subsystem of the plurality of subsystems is performing an action that will cause a step increase in power.

10. A method comprising:

generating an estimate of power that will be drawn from a battery over an upcoming window of time;

generating an estimate of battery capability over the upcoming window of time, based on the estimate of power;

generating a first power budget for a subsystem powered by the battery, the first power budget based on the estimate of battery capability;

generating a second power budget for the subsystem, the second power budget based on a closed-loop feedback path;

determining a final power budget for the subsystem, the final power budget based on the first power budget and the second power budget, wherein determining the final respective power budget comprises determining a weighted sum of the first respective power budget and the second respective power budget;

providing the final power budget to the subsystem; and adjusting power usage of the subsystem based on the final power budget.

11. The method of claim 10, wherein the final power budget comprises an indication of a maximum power level for use by the subsystem.

12. The method of claim 11, wherein the subsystem comprises a speaker, wherein adjusting power usage of the subsystem based on the final power budget comprises adjusting a volume level of audio output from the speaker such that the power level of the subsystem remains below the maximum power level.

13. The method of claim 10, wherein generating the estimate of battery capability over the upcoming window of time is performed in response to determining that the subsystem is performing an action that will cause a step increase in power.

14. A power management device comprising:

a long-term power estimator configured to generate an estimate of power that will be drawn from a battery over an upcoming window of time;

a long-term battery capability predictor configured to generate an estimate of capability of the battery over the upcoming window of time, based on the estimate of power and a present state of the battery;

a long-term controller configured to generate one or more long-term power budgets for respective one or more subsystems powered by the battery, wherein the long-term power budgets are configured to prevent the one or more subsystems from exceeding the capability of the battery over the upcoming window of time;

a closed-loop controller configured to generate one or more closed-loop power budgets for the one or more subsystems, wherein the closed-loop power budgets are based on power levels observed over a past window of time; and a budget controller configured to provide one or more output power budgets to the one or more subsystems, wherein a respective one of the output power budgets comprises a weighted sum of a respected one of the long-term budgets and a respective one of the closed-loop budgets.

15. The power management device of claim 14, wherein generating the estimate of capability of the battery over the upcoming window of time is performed periodically, wherein the period varies based on at least one of present power output of the battery or the most recent estimate of capability of the battery.

\* \* \* \* \*